United States Patent
Joshi et al.

(10) Patent No.: US 7,122,488 B2
(45) Date of Patent: Oct. 17, 2006

(54) HIGH DENSITY PLASMA PROCESS FOR THE FORMATION OF SILICON DIOXIDE ON SILICON CARBIDE SUBSTRATES

(75) Inventors: Pooran Chandra Joshi, Vancouver, WA (US); Apostolos T. Voutsas, Vancouver, WA (US); John W. Hartzell, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 65 days.

(21) Appl. No.: 10/812,591

(22) Filed: Mar. 29, 2004

(65) Prior Publication Data

US 2005/0215066 A1 Sep. 29, 2005

Related U.S. Application Data

(63) Continuation-in-part of application No. 10/801,374, filed on Mar. 15, 2004, and a continuation-in-part of application No. 10/801,377, filed on Mar. 15, 2004.

(51) Int. Cl.
*H01L 21/469* (2006.01)
*H01L 21/31* (2006.01)

(52) U.S. Cl. ............... 438/788; 438/772; 257/E21.079; 257/E21.283; 257/E21.312

(58) Field of Classification Search ............... None
See application file for complete search history.

(56) References Cited

U.S. PATENT DOCUMENTS

| | | | |
|---|---|---|---|
| 4,888,820 A * | 12/1989 | Chen et al. | 361/313 |
| 5,135,885 A * | 8/1992 | Furukawa et al. | 438/167 |
| 6,136,727 A | 10/2000 | Ueno | 438/770 |
| 6,437,371 B1 | 8/2002 | Lipkin et al. | 257/77 |
| 6,482,704 B1 | 11/2002 | Amano et al. | 438/285 |
| 2003/0059556 A1 * | 3/2003 | Ouellet et al. | 427/569 |
| 2004/0129673 A1 * | 7/2004 | Belyansky et al. | 216/67 |

OTHER PUBLICATIONS

"Rapid oxidation of SiC using microwave-discharged $O_2$ plasma at low temperatures (<300° C.)", M. Satoh, H. Shimada, T. Nakamura, and S. Yanagihara, Japanese Journal of Applied Physics, vol. 41, pp. L233-L235, 2002.

* cited by examiner

*Primary Examiner*—Asok Kumar Sarkar
(74) *Attorney, Agent, or Firm*—Law Office of Gerald Maliszewski; Gerald Maliszewski

(57) ABSTRACT

Methods are provided for forming silicon dioxide (SiO2) on a silicon carbide (SiC) substrate. The method comprises: providing a SiC substrate; supplying an atmosphere including oxygen; performing a high-density (HD) plasma-based process; and, forming a SiO2 layer overlying the SiC substrate. Typically, performing the HD plasma-based process includes connecting a top electrode to an inductively coupled HD plasma source. In one aspect, SiO2 is grown on the SiC substrate. Then, an HD plasma oxidation process is performed that creates a reactive oxygen species and breaks the Si—C bonds in the SiC substrate, to form free Si and C atoms in the SiC substrate. The free Si atoms in the SiC substrate are bonded to the HD plasma-generated reactive oxygen species, and the SiO2 layer is grown.

31 Claims, 6 Drawing Sheets

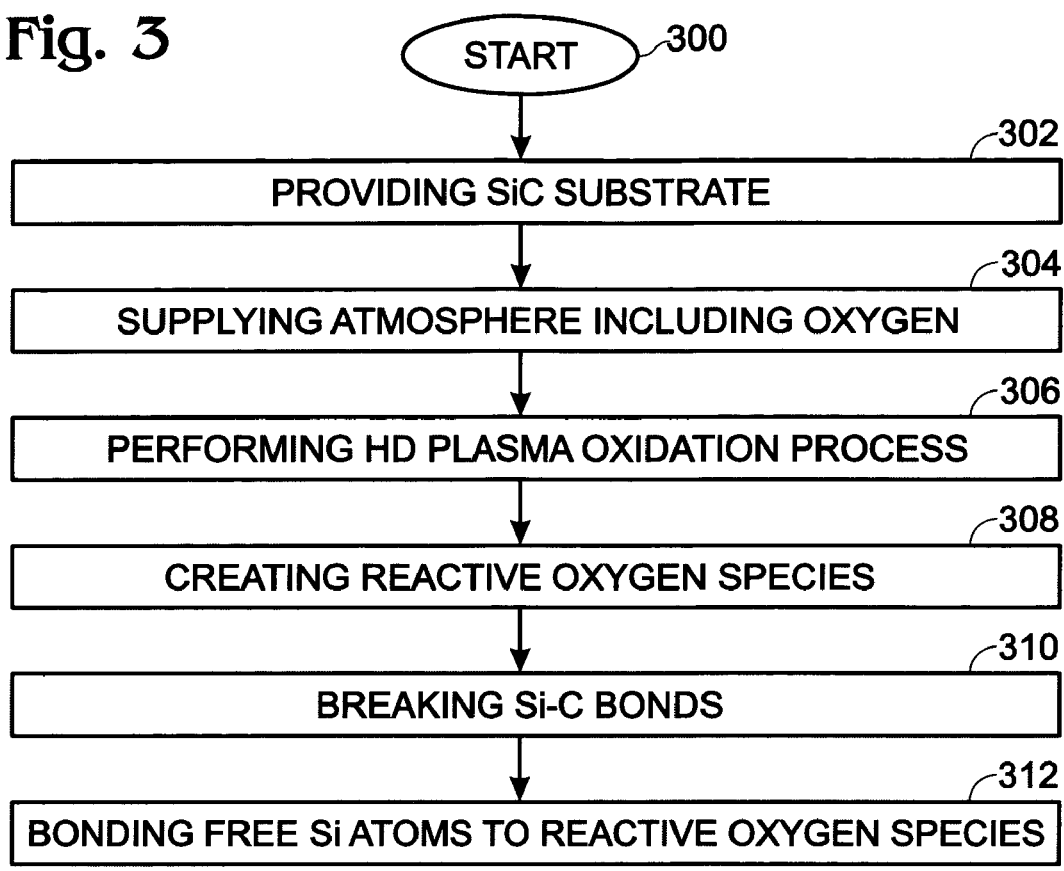
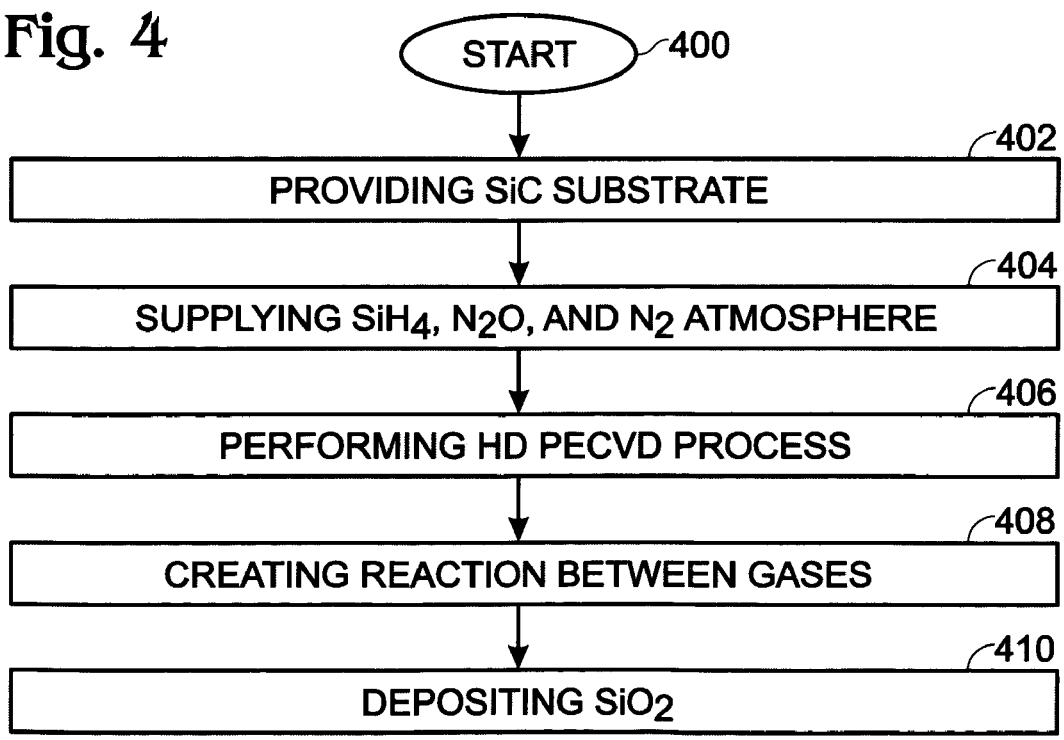

HIGH DENSITY PLASMA PROCESS FOR THE FORMATION OF SILICON DIOXIDE ON SILICON CARBIDE SUBSTRATES

RELATED APPLICATIONS

This application is a continuation-in-part of a pending patent application entitled, METHODS FOR FABRICATING OXIDE THIN FILMS, invented by Joshi et al., Ser. No. 10/801,374, filed Mar. 15, 2004.

This application is a continuation-in-part of a pending patent application entitled, DEPOSITION OXIDE WITH IMPROVED OXYGEN BONDING, invented by Pooran Joshi, Ser. No. 10/801,377, filed Mar. 15, 2004.

BACKGROUND OF THE INVENTION

1. Field of the Invention

This invention generally relates to integrated circuit (IC) fabrication and, more particularly, to a system and method for forming silicon dioxide films overlying a silicon carbide substrate, 2. Description of the Related Art The silicon-based (silicon substrate) MOSFET is the most commonly manufactured electronic device, worldwide. However, Si-based devices, including MOSFETs, fail under extreme operating conditions, such as high temperature, high power, and high radiation. There is a growing interest in semiconductor materials and devices that can be used in high temperature, high power, high frequency, and radiation hard applications. Silicon carbide (SiC) is a promising semiconductor for these electronic applications because of its wide energy bandgap, high saturated electron velocity, high thermal conductivity, chemical inertness, and high breakdown field strength. Rapid advances in the growth, doping, and the processing of SiC have led to the realization of several electronic and photonic devices that use SiC substrates, including fast recovery high voltage diodes, metal oxide semiconductor field effect transistors (MOSFETs), metal semiconductor field effect transistors (MESFETs), static induction transistors (SITs), junction field effect transistors (JFETs), and UV photodiodes. The wide bandgap and high thermal conductivity are attractive for high temperature digital integrated circuits and nonvolatile solid-state memories. SiC bipolar devices, bipolar junction transistors (BJTs), and hybrid bipolar transistors (HBTs) have application-specific advantages, as compared to Si bipolar devices. Higher doping can be used for SiC devices, resulting in a smaller on-resistance that is due to the higher breakdown field strength of SiC.

A remarkable property of the SiC is that it has a native oxide-like Si. SiC can be thermally oxidized, like Si, to form $SiO_2$. However, SiC MOSFET performance is hampered by a high density of interface states. As a result, carrier mobility is significantly reduced and the current (power) handling capability of these devices is much lower than would otherwise be expected. The thermal oxidation of SiC is typically carried out at temperatures in the range of 1000–1300° C. This high-temperature thermal oxidation process can be harmful to some conventionally used IC materials such as glass or plastic. However, oxidation at lower temperatures conventionally requires excessively long oxidation times.

It would be advantageous if a high quality silicon dioxide layer could be formed overlying a SiC substrate at a relatively low temperature.

SUMMARY OF THE INVENTION

The present invention describes a novel growth/deposition method for the fabrication of $SiO_2$ thin films by high-density plasma-based processes, employing an inductively coupled plasma source. The high-density plasma processes generate high electron/ion concentrations, with suitable electron temperatures, to enhance the growth/deposition of $SiO_2$ film on SiC. The high-density plasma process is characterized by high electron/ion concentration, low plasma potential, and independent control of plasma energy and density. The high-density plasma growth/deposition process is effective in controlling the bulk and interfacial properties of the $SiO_2$ thin film, which are critical for the fabrication of high performance and reliable electronic devices. The high electron/ion energy, low plasma potential, and high electron temperature of the high-density ICP plasma process make it possible to fabricate $SiO_2$ thin films at significantly lower thermal budgets, as compared to the conventional thermal, and plasma-based physical and chemical techniques.

Accordingly, a method is provided for forming SiO2 on a silicon carbide (SiC) substrate. Generally, the method comprises: providing a SiC substrate; supplying an atmosphere including oxygen; performing a high-density (HD) plasma-based process; and, forming a SiO2 layer overlying the SiC substrate. Typically, performing the HD plasma-based process includes connecting a top electrode to an inductively coupled HD plasma source.

In one aspect, SiO2 is grown on the SiC substrate. That is, an HD plasma oxidation process is performed that creates a reactive oxygen species and breaks the Si—C bonds in the SiC substrate, to form free Si and C atoms in the SiC substrate. The free Si atoms in the SiC substrate are bonded to the HD plasma generated reactive oxygen species, and the SiO2 layer is grown.

In a second aspect, the atmosphere includes SiH4, N2O, and N2, and an HD plasma enhanced chemical vapor deposition (PECVD) process causes a reaction between the gases in the atmosphere. SiO2 is deposited over the SiC. In a third aspect, a Si layer is deposited prior to a HD plasma-based process. Then, an HD oxidation process creates a reactive oxygen species, and Si atoms in the Si layer are bonded to the reactive oxygen species, growing a SiO2 layer overlying the Si layer.

In a fourth aspect, a Si layer is deposited. An HD oxidation process is initially performed to create a reactive oxygen species. Subsequently, an HD PECVD process is performed, causing a reaction between SiH4, N2O, and N2 gases in the atmosphere. As a result, SiO2 is formed over the Si layer by a combination of growing and depositing SiO2.

In a fifth aspect, an HD oxidation process creates a reactive oxygen species and free Si atoms in the SiC substrate are bonded to the HD plasma generated reactive oxygen species, to grow a SiO2 layer. Then, the SiO2 layer is etched, exposing a region of the SiC substrate, and metal is deposited in the exposed region of SiC substrate to form a metal-semiconductor (Schottky) contact.

Additional details of the above-described methods are provided below.

BRIEF DESCRIPTION OF THE DRAWINGS

FIG. 3 is a flowchart illustrating the present invention method for growing SiO2 on a SiC substrate.

FIG. 4 is a flowchart illustrating the present invention method for depositing SiO2 on a SiC substrate.

DETAILED DESCRIPTION OF THE PREFERRED EMBODIMENTS

Figure 1:
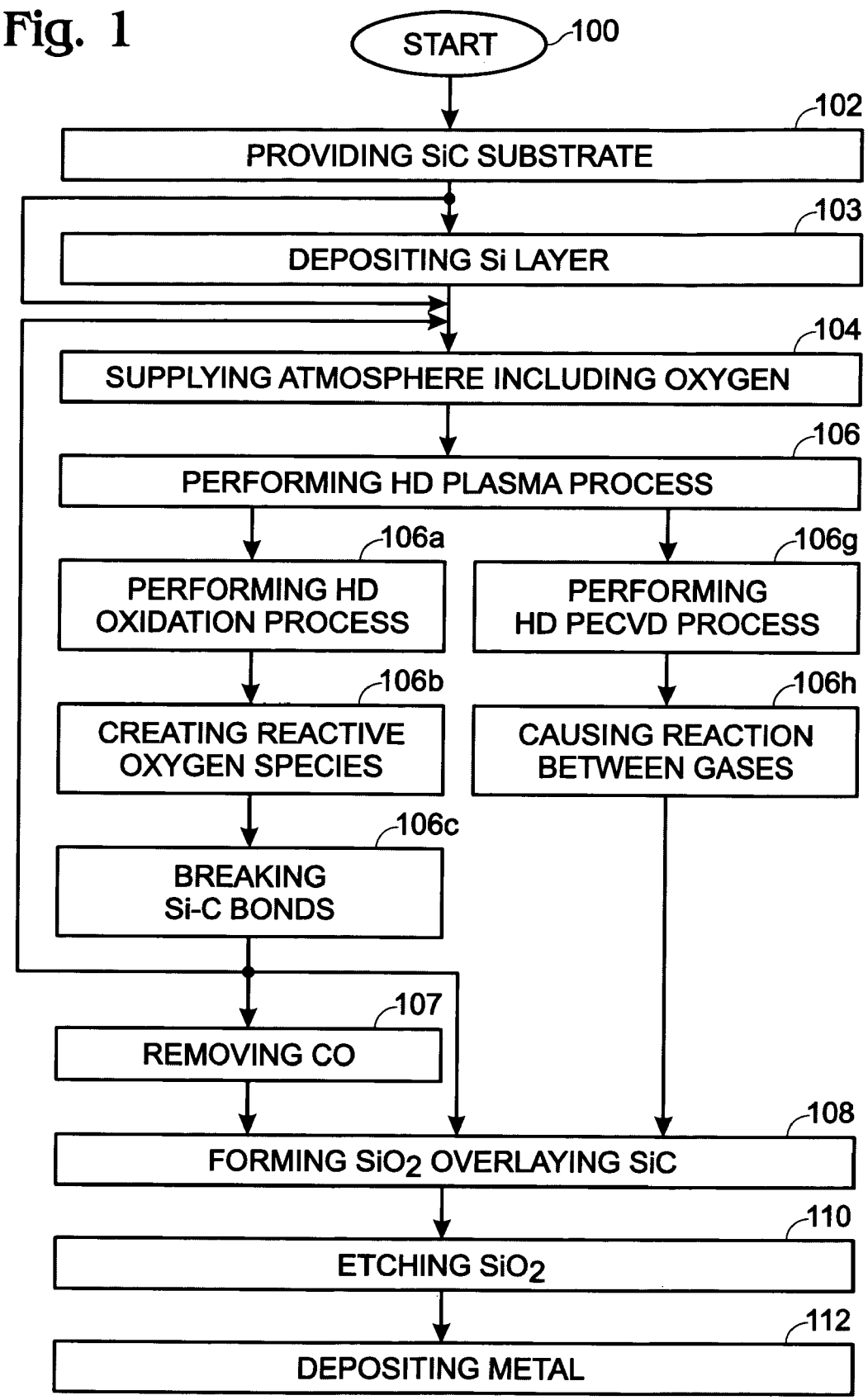
FIG. 1 is a flowchart generally illustrating the present invention method for forming silicon dioxide (SiO2) on a silicon carbide (SiC) substrate.

FIG. 1 is a flowchart generally illustrating the present invention method for forming silicon dioxide (SiO2) on a silicon carbide (SiC) substrate. Although the method (and the methods described below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 100.

Step 102 provides a SiC substrate. Step 104 supplies an atmosphere including oxygen. Step 106 performs a high-density (HD) plasma-based process. Step 108 forms a SiO2 layer overlying the SiC substrate. Preferably, performing an HD plasma-based process in Step 106 includes connecting a top electrode to an inductively coupled HD plasma source.

Figure 2:
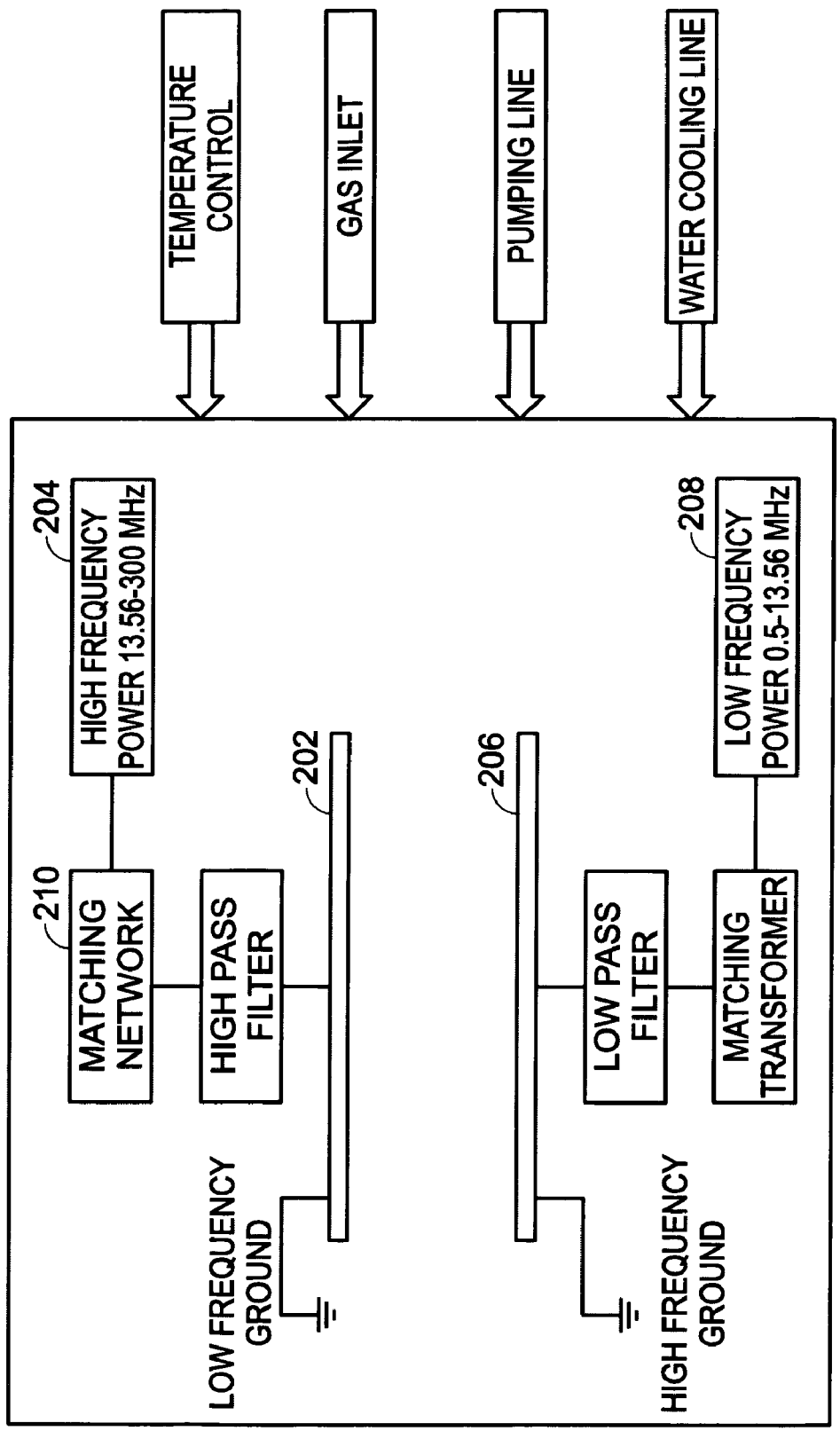
FIG. 2 is a schematic block diagram of an inductively coupled high-density plasma source.

FIG. 2 is a schematic block diagram of an inductively coupled high-density plasma source. Although an inductively coupled source is shown, the present invention process can be enabled using any suitable high density plasma source. The present invention methods may be enabled using the inductively coupled plasma (ICP) source, for the fabrication of $SiO_2$ thin films grown/deposited on SiC substrates. The system 200 can be used for both the growth and deposition of $SiO_2$ thin films. The top electrode 202 is driven by a high frequency radio frequency (RF) source 204, while the bottom electrode 206 is driven by a low frequency power source 208. The RF power is coupled to the top electrode through a matching network 210. The bottom electrode 206 power can be varied independently of the top electrode 202. The top electrode power frequency can be in the range of 13.56 megahertz (MHz) to 300 MHz, depending on the design of the ICP source 204. The bottom electrode power frequency can be varied in the frequency range of 50 kilohertz (kHz) to 13.56 MHz, to control the growth/deposition process. The system pressure is monitored up to 1 Torr. The top electrode power may be as great as 10 watts per square centimeter (W/cm$^2$), while the bottom electrode power can be as great as 3 W/cm$^2$.

Returning to FIG. 1, in a first aspect of the method, SiO2 is grown on the SiC substrate. In this aspect, performing an HD plasma-based process in Step 106 includes substeps. Step 106a performs an HD plasma oxidation process. Step 106b creates a reactive oxygen species in response to the HD oxidation process. Step 106c breaks the Si—C bonds in the SiC substrate, to form free Si and C atoms in the SiC substrate. Then, forming a SiO2 layer overlying the SiC substrate in Step 108 includes bonding the free Si atoms in the SiC substrate to the HD plasma generated reactive oxygen species, and growing the SiO2 layer.

In some aspects, Step 102 maintains the SiC substrate at a temperature of 360 degrees C., or less. Step 104 supplies O2 with an inert gas, where the ratio of inert gas to O2 is in the rage between 10:1 and 200:1. For example, an inert gas such as He, Kr, or Ar may be used.

In this first aspect, The HD oxidation process of Step 106 may bond the free C atoms in the SiC substrate with the reactive oxygen species, forming carbon monoxide (CO). Then, a further step, Step 107 removes the CO from the process. This step is advantageous as C is generally considered to be a contaminant in IC processes.

More specifically, Step 104 supplies a pressure of up to 500 milliTorr (mTorr), with a mixture of inert gas and oxygen in a ratio of approximately 10:1 to 200:1, and a total gas flow of approximately 50 to 200 standard cubic centimeters per minute (sccm). Performing an HD plasma-based oxidation process may include the following substeps (not shown). Step 106d locates the SiC substrate between a bottom electrode and the top electrode. Step 106e supplies a power density of up to 10 watts per square centimeter (W/cm$^2$), at a frequency in the range of 13.56 to 300 megahertz (MHz), to the top electrode. Step 106f supplies a power density of up to 3 W/cm$^2$, at a frequency in the range of 50 kilohertz (KHz) to 13.56 MHz, to the bottom electrode.

In one aspect, Step 104 supplies a He/O2 atmosphere, and forming a SiO2 layer overlying the SiC substrate in Step 108 includes forming a SiO2 layer at deposition rate of about 100 Å, in 10 minutes.

In a second, deposition aspect of the method, Step 104 supplies SiH4, N2O, and N2. Then, performing an HD plasma-based process in Step 106 includes alternate substeps. Step 106g performs an HD plasma enhanced chemical vapor deposition (PECVD) process. Step 106h, in response to the HD PECVD process, causes a reaction between the gases in the atmosphere. Then, forming a SiO2 layer overlying the SiC substrate in Step 108 includes depositing a SiO2 layer over the SiC.

In one aspect, Step 102 maintains the SiC substrate at a temperature of 400 degrees C., or less. Alternately, the temperature may be 150 degrees C., or less. Step 104 supplies SiH4, N2O, and N2 in a ratio of 10–25:100:50. In another aspect, Step 104 maintains an atmosphere pressure in the range of 10 to 500 mTorr.

More specifically, Step 104 supplies a pressure of up to 500 mTorr, with a mixture of inert gas and oxygen in a ratio of approximately 10:1 to 200:1, and a total gas flow of approximately 50 to 200 sccm. Performing a HD plasma-based PECVD process may include the following substeps (not shown). Step 106d locates the SiC substrate between a bottom electrode and the top electrode. Step 106e supplies a power density of up to 10 W/cm$^2$, at a frequency in the range of 13.56 to 300 MHz, to the top electrode. Step 106f supplies a power density of up to 3 W/cm$^2$, at a frequency in the range of 50 KHz to 13.56 MHz, to the bottom electrode.

In one aspect, Step 108 forms a SiO2 layer having a bias temperature stress (BTS) of less than 1 volt, at 150 degrees C., with a bias voltage of +/−2 megavolts per centimeter (MV/cm). In another aspect, Step 108 forms a SiO2 layer having a breakdown strength of greater than 10 MV/cm.

Further, the SiO2 layer formed in Step 108 has a leakage current density of less than $1 \times 10^{-7}$ amps per square centimeter (A/cm$^2$), at an applied field of 8 megavolts per centimeter (MV/cm).

In a third aspect of the method, the SiO2 layer is grown over a silicon layer, formed on the SiC substrate. Step 102 maintains the SiC substrate at a temperature of 400 degrees C., or less. Step 103, prior to the HD plasma-based process of Step 106, deposits a Si layer overlying the SiC substrate. The deposited Si may be amorphous Si, polycrystalline Si, or single-crystal Si. Then, performing an HD plasma-based process in Step 106 includes substeps. Step 106a performs an HD oxidation process. Step 106b, in response to the HD oxidation process, creates a reactive oxygen species. Then, forming a SiO2 layer overlying the SiC substrate in Step 108 includes bonding Si atoms in the Si layer to the reactive oxygen species, and growing a SiO2 layer overlying the Si layer.

More specifically, Step 104 supplies a pressure of up to 500 mTorr, with a mixture of inert gas and oxygen in a ratio of approximately 10:1 to 200:1, and a total gas flow of approximately 50 to 200 sccm. For example, the inert gas may be helium, argon, or krypton. Performing a HD plasma-based oxidation process may include the following substeps (not shown). Step 106d locates the SiC substrate between a bottom electrode and the top electrode. Step 106e supplies a power density of up to 10 W/cm$^2$, at a frequency in the range of 13.56 to 300 MHz, to the top electrode. Step 106f supplies a power density of up to 3 W/cm$^2$, at a frequency in the range of 50 KHz to 13.56 MHz, to the bottom electrode.

In a fourth aspect, a Si layer is deposited over the SiC substrate, and SiO2 is both grown and deposited on the Si layer. Step 102 maintains a SiC substrate temperature of 400 degrees C., or less. Step 103 deposits a Si layer. The Si can be amorphous, poly, or single-crystal Si. Step 106a initially performs an HD oxidation process. Step 106b, in response to the HD oxidation process, creates a reactive oxygen species. Step 106g subsequently performs a HD PECVD process. Step 106h, in response to the HD PECVD process, causes a reaction between (SiH4, N2O, and N2) gases in the atmosphere. With respect to Steps 106g and 106h, Step 104 supplies SiH4, N2O, and N2 gases. Then, Step 108 forms a SiO2 layer over the Si layer by a combination of growth and deposition processes.

The following steps are common to both the oxidation and PECVD plasma-based processes of the fourth aspect. Step 104 supplies a pressure of up to 500 mTorr, with a mixture of inert gas and oxygen in a ratio of approximately 10:1 to 200:1, and a total gas flow of approximately 50 to 200 sccm. Step 106d locates the SiC substrate between a bottom electrode and the top electrode. Step 106e supplies a power density of up to 10 W/cm$^2$, at a frequency in the range of 13.56 to 300 MHz, to the top electrode. Step 106f supplies a power density of up to 3 W/cm$^2$, at a frequency in the range of 50 KHz to 13.56 MHz, to the bottom electrode.

With respect to the HD plasma oxidation process, Step 104 uses an inert gas such as helium, argon, or krypton. With respect to the HD PECVD process, Step 104 supplies SiH4, N2O, and N2 in a ratio of 10–25:100:50.

In a fifth aspect, a Schottky contact is formed. Step 106a performs an HD oxidation process. Step 106b, in response to the HD oxidation process, creates a reactive oxygen species. Step 106c forms a SiO2 layer overlying the SiC substrate by bonding the free Si atoms in the SiC substrate to the HD plasma generated reactive oxygen species, and growing the SiO2 layer. See the first aspect of the invention, described above, for additional details. Then, Step 110 etches the SiO2 layer, exposing a region of the SiC substrate. Step 112 deposits a metal in the exposed region of SiC substrate to form a metal-semiconductor contact.

To clarify the present invention method, the five aspects described above are each summarized and explained below with the use of separate flowcharts.

FIG. 3 is a flowchart illustrating the present invention method for growing SiO2 on a SiC substrate. The method starts at Step 300. Step 302 provides a SiC substrate at a temperature of 360 degrees C., or less. Step 304 supplies an atmosphere including oxygen. Step 306 performs an HD plasma oxidation process. Step 308, in response to the HD oxidation process, creates a reactive oxygen species. Step 310 breaks the Si—C bonds in the SiC substrate, to form free Si and C atoms in the SiC substrate. Step 312 bonds the free Si atoms in the SiC substrate to the HD plasma-generated reactive oxygen species, and grows the SiO2 layer.

FIG. 4 is a flowchart illustrating the present invention method for depositing SiO2 on a SiC substrate. The method starts at Step 400. Step 402 provides a SiC substrate at a temperature of 400 degrees C., or less. In some aspects, the temperature is 150 degrees, or less. Step 404 supplies an atmosphere including SiH4, N2O, and N2. Step 406 performs an HD plasma enhanced chemical vapor deposition (PECVD) process. Step 408, in response to the HD PECVD process, causes a reaction between the gases in the atmosphere. Step 410 deposits a SiO2 layer over the SiC.

Figure 5:
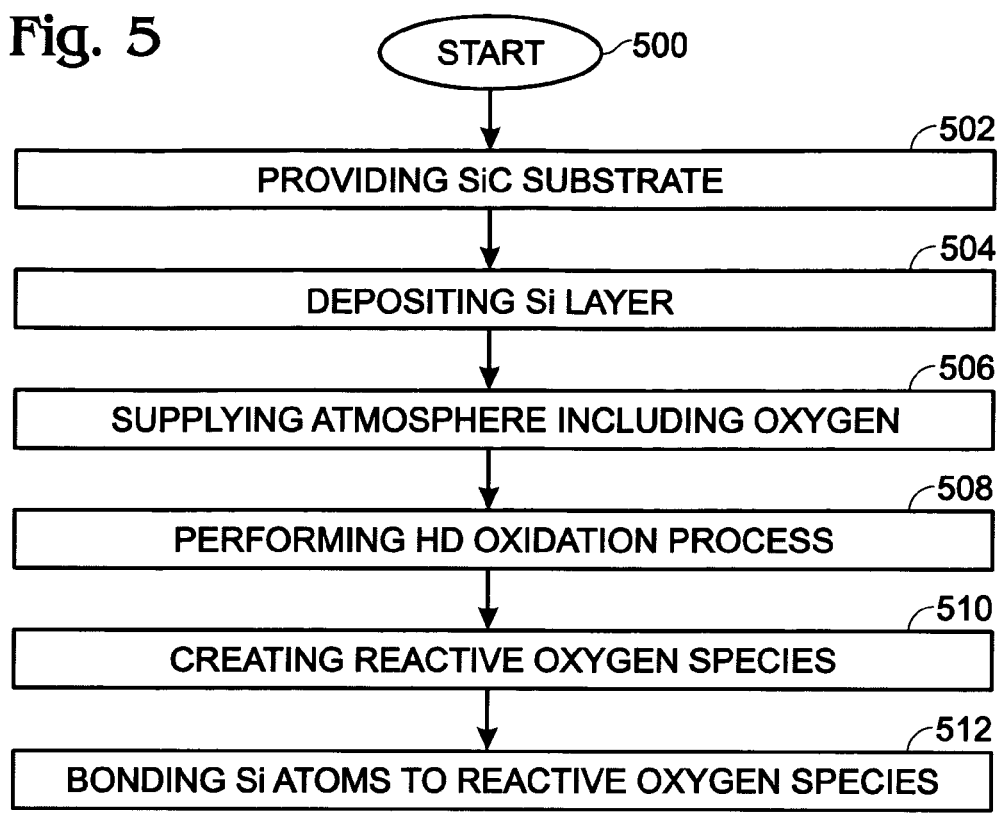
FIG. 5 is a flowchart illustrating a sacrificial Si method for growing SiO2 on a Si/SiC structure.

FIG. 5 is a flowchart illustrating a sacrificial Si method for growing SiO2 on a Si/SiC structure. The method starts at Step 500. Step 502 provides a SiC substrate at a temperature of 400 degrees C., or less. Step 504 deposits a layer of Si overlying the SiC. Step 506 supplies an atmosphere including oxygen. Step 508 performs an HD oxidation process. Step 510, in response to the HD oxidation process, creates a reactive oxygen species. Step 512 bonds Si atoms in the Si layer to the reactive oxygen species, growing a SiO2 layer overlying the Si layer.

Figure 6:
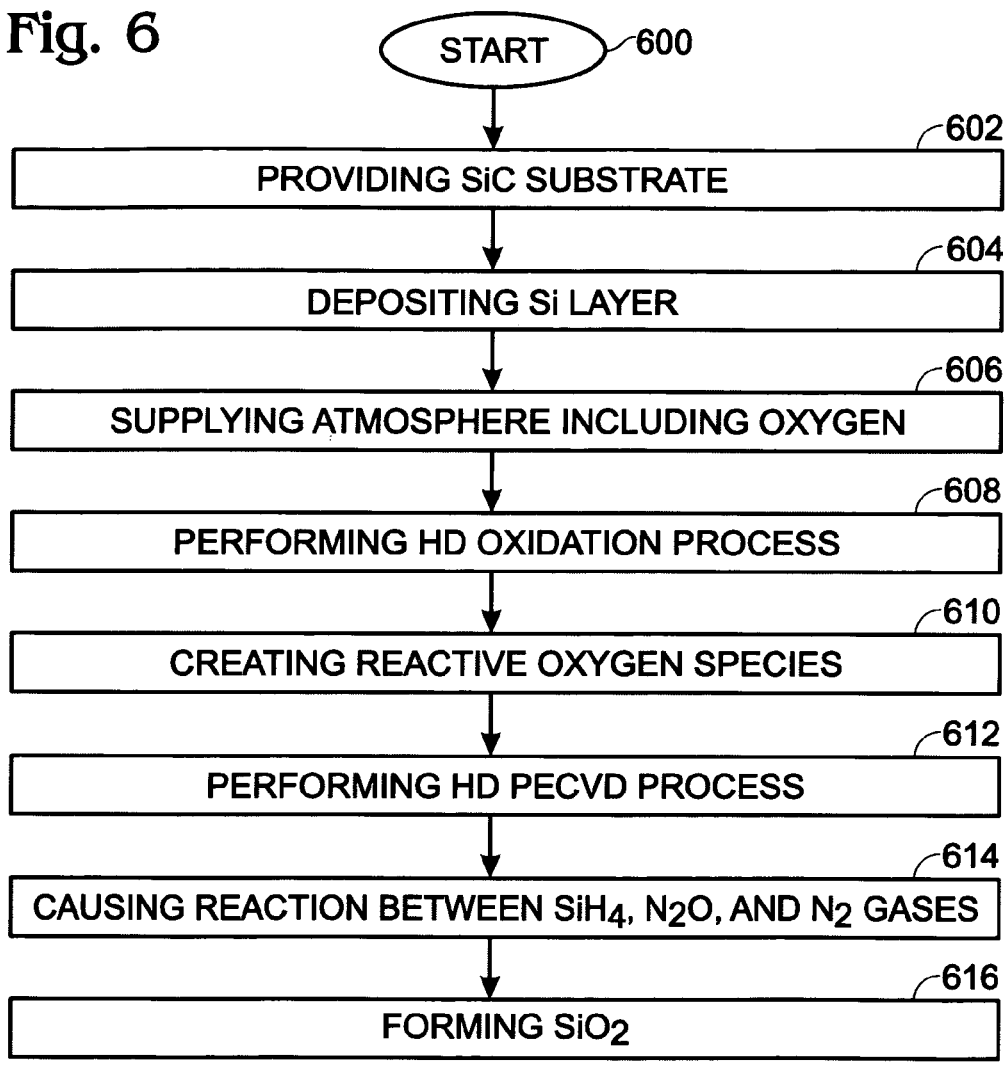
FIG. 6 is a flowchart illustrating the present invention method for forming SiO2 on a SiC substrate using growth and deposition processes.

FIG. 6 is a flowchart illustrating the present invention method for forming SiO2 on a SiC substrate using growth and deposition processes. The method starts at Step 600. Step 602 provides a SiC substrate at a temperature of 400 degrees, or less. Step 604 deposits a Si layer overlying the SiC. Step 606 supplies an atmosphere including oxygen. Step 608 initially performs an HD oxidation process. Step 610, in response to the HD oxidation process, creates a reactive oxygen species. Step 612 subsequently performs a HD PECVD process. Step 614, in response to the HD PECVD process, causes a reaction between SiH4, N2O, and N2 gases in the atmosphere. Step 616 forms a SiO2 layer overlying the Si layer by a combination of growing and depositing SiO2 layer.

Figure 7:
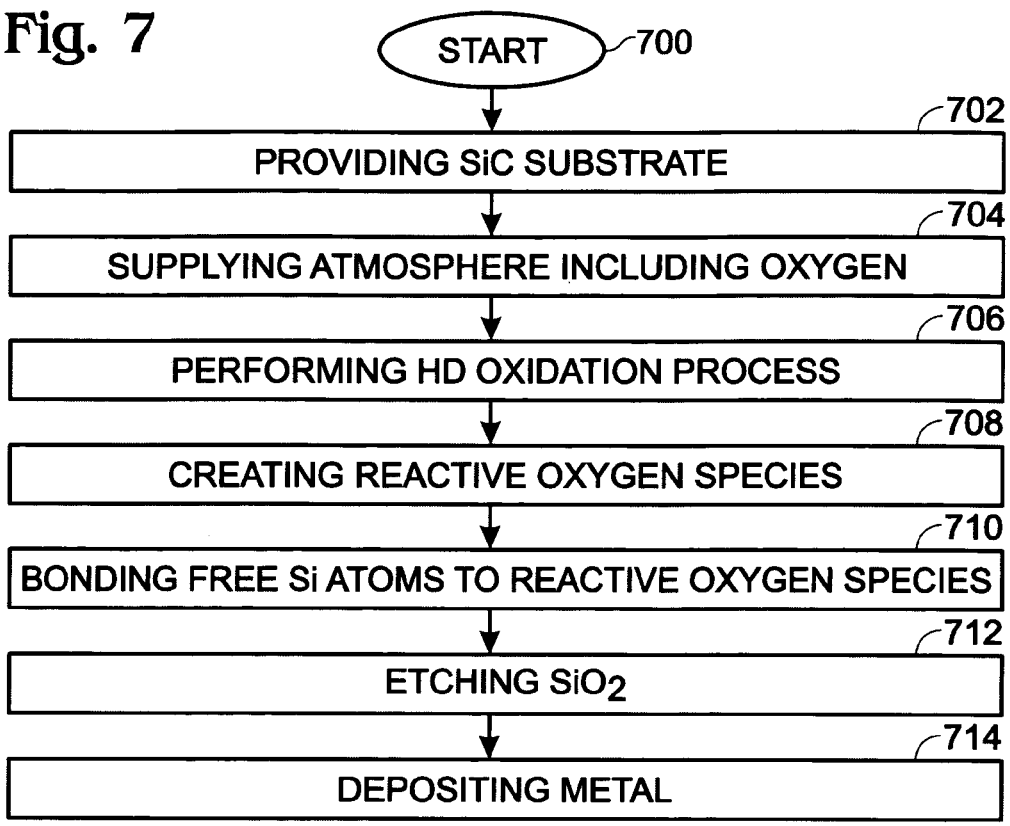
FIG. 7 is a flowchart illustrating the present invention method for forming a Schottky contact on a SiC substrate.

FIG. 7 is a flowchart illustrating the present invention method for forming a Schottky contact on a SiC substrate. The method starts at Step 700. Step 702 provides a SiC substrate. Step 704 supplies an atmosphere including oxygen. Step 706 performs an HD oxidation process. Step 708, in response to the HD oxidation process, creates a reactive oxygen species. Step 710 bonds the free Si atoms in the SiC substrate to the HD plasma-generated reactive oxygen species, and grows an SiO2 layer. Step 712 etches the SiO2 layer, exposing a region of the SiC substrate. Step 714 deposits a metal in the exposed region of SiC substrate to form a metal-semiconductor contact.

The present invention procedures describe a novel high-density plasma-based approach to the growth/deposition of high quality SiO$_2$ thin films on SiC substrates at temperatures significantly lower (less than 400° C.) than conventional thermal growth temperatures. The high density plasma grown/deposited $SiO_2$ thin films solve major issues related to SiC-based device technology, such as the low temperature processing of passivation layers, high quality Schottky contacts, uniform oxide growth on non-planar devices, and efficient removal of C from the interface and bulk of the film.

The present invention methods describe high-density plasma growth/deposition processes using an inductively coupled plasma (ICP) source. High electron/ion concentrations are generated, with high electron temperatures sufficient to enhance the growth/deposition process of the $SiO_2$ thin films on SiC, by creating highly reactive oxygen and other precursor fragments. The high-density plasma process is effective in enhancing the growth/deposition kinetics even when low thermal energies are supplied to the substrate. The active oxygen species can also efficiently convert the residual C in the film, to CO for its removal. The high-density plasma process is carried out at low pressures to achieve high electron density ($>10^{10}$ cm$^{-3}$), which significantly reduces particle generation during the process. One of the significant characteristics of the high-density plasma process is the low plasma potential, which makes it possible to independently control the substrate bias. Independent control of the plasma energy and density make possible better growth/deposition kinetics, as well as better SiO2 bulk and interfacial properties.

Figure 8:
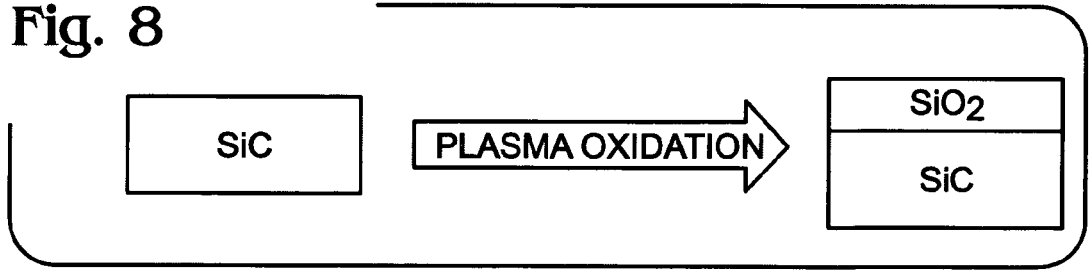
FIG. 8 is a partial cross-sectional view of a SiO2/SiC interface formed by growing the SiO2 (see FIG. 3).

FIG. 8 is a partial cross-sectional view of a SiO2/SiC interface formed by growing the SiO2 (see FIG. 3). The substrate is exposed to the oxidizing atmosphere in the chamber. The growth process uses a combination of inert gases and $O_2$ for the generation of active oxygen species for the growth of $SiO_2$. The high-density plasma is effective in creating the reactive oxygen species needed to oxidize the substrate surface and form a $SiO_2$ layer of the desired thickness. The power applied to the top and bottom electrodes, and the substrate temperature can be controlled to obtain desired film growth and film properties. The ratio of the inert gas to oxygen flow rates can be adjusted to control the concentration and energy of the reactive oxygen species. The ratio of the inert gas and oxygen can be varied in the range of 10:1 and 200:1. The high plasma energy and density of the high-density plasma process enhances the $SiO_2$ growth rate and other important properties, while the low plasma potential minimizes the damage to the growing film and its interface with the substrate.

The present invention high-density plasma oxidation growth concepts have also been successfully applied to the growth of $SiO_2$ thin films on Si substrates. The pending patent applications mentioned in the Related Applications Section above, namely METHODS FOR FABRICATING OXIDE THIN FILMS, invented by Joshi et al., and DEPOSITION OXIDE WITH IMPROVED OXYGEN BONDING, invented by Pooran Joshi, are incorporated herein by reference.

In these applications, the growth of $SiO_2$ by oxidation of a Si surface is analyzed using various combinations of inert gas (such as He, Kr, or Ar) and $O_2$. The wafer temperature is maintained at 360° C. and energy is inductively coupled plasma at 13.56 MHz, at a power density of 1.6 W/cm$^2$.

Figure 9:
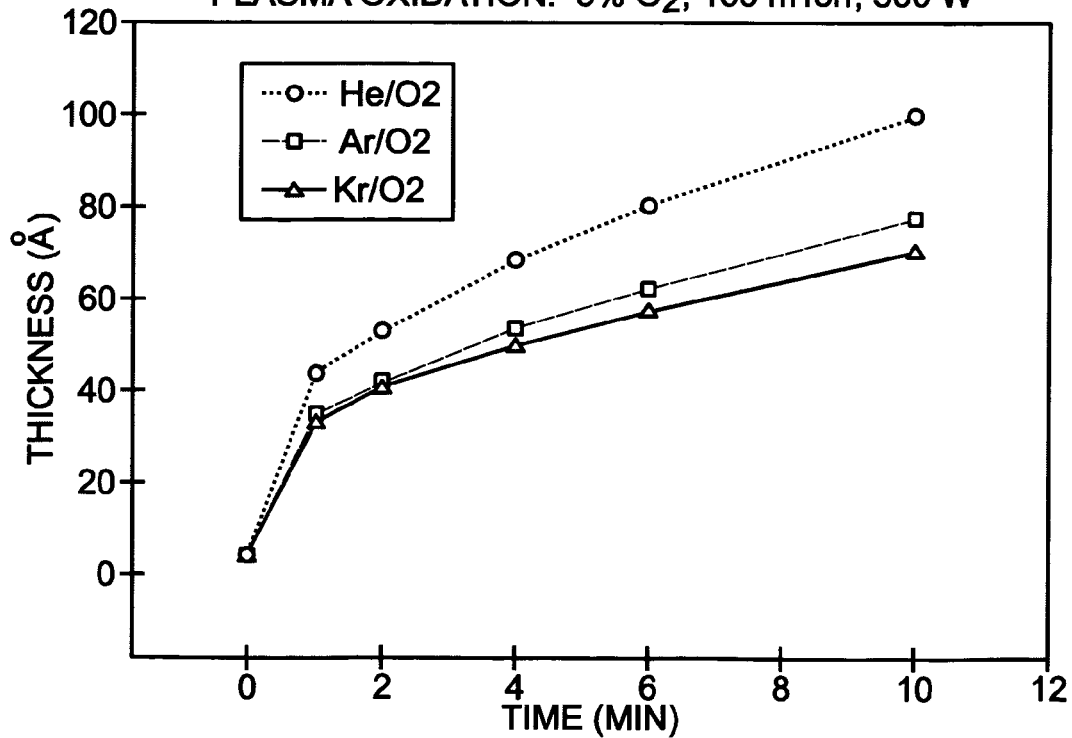
FIG. 9 is a plot of oxide growth on a Si substrate vs. deposition time, using various inert gases.

FIG. 9 is a plot of oxide growth on a Si substrate vs. deposition time, using various inert gases. The observed $SiO_2$ growth rates are substantial at temperatures of 360° C., temperatures at which thermal growth is impractical. The results clearly establish that the high-density plasma can significantly enhance reaction kinetics, even at lower substrate thermal energy levels.

Figure 10:
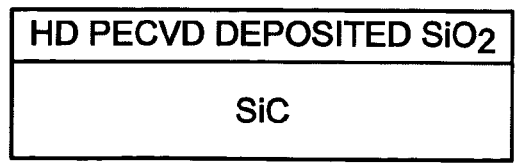
FIG. 10 is a partial cross-sectional view of SiC substrate with an overlying SiO2 layer formed by HD PECVD process.

FIG. 10 is a partial cross-sectional view of SiC substrate with an overlying SiO2 layer formed by HD PECVD process. The $SiO_2$ thin film can be deposited on SiC, at low temperatures (<400° C.) by the HD-PECVD technique using suitable precursors and reactive gases. The deposition of a high quality oxide film on SiC solves major issues related to interface reliability and carbon contamination. The $SiO_2$ thin film deposition process involves reactions among plasma-generated species in the gas phase, as well as on the substrate surface. The high-density plasma process offers the significant advantage of a low plasma potential that minimizes any damage to the substrate surface. A high quality $SiO_2$/SiC interface is formed with minimal damage caused by the incident plasma species. The high plasma energy and density make it possible to obtain high deposition rates suitable for most device applications. The HD-PECVD also permits the depositing of high quality $SiO_2$ thin films on Si at temperatures lower than 400° C. For example, HD-PECVD gate oxide layers can be deposited at 360° C. in a high-density inductively coupled plasma CVD system, using $SiH_4$, $N_2O$, and $N_2$ gas ratios of 10–25:100:50. The pressure is maintained at 50 to 250 mTorr and the power used is from 0.2 to 1.6 W/cm$^2$. The quality of the layer is demonstrated to be superior to those deposited by various physical and chemical techniques through measurements of the bias temperature stress (BTS), film leakage current density, and physical breakdown strength. For example, the above-mentioned 360° C. film has a BTS shift of less than 1V, under stress at 150° C. at a bias voltage of ±20V. The breakdown strength exceeds 10 MV/cm. The leakage current density is lower than $10^{-7}$ A/cm$^2$ at an applied electric field of 8 MV/cm. This film quality can be maintained at thicknesses as low as 10 nanometers (nm).

Figure 11:
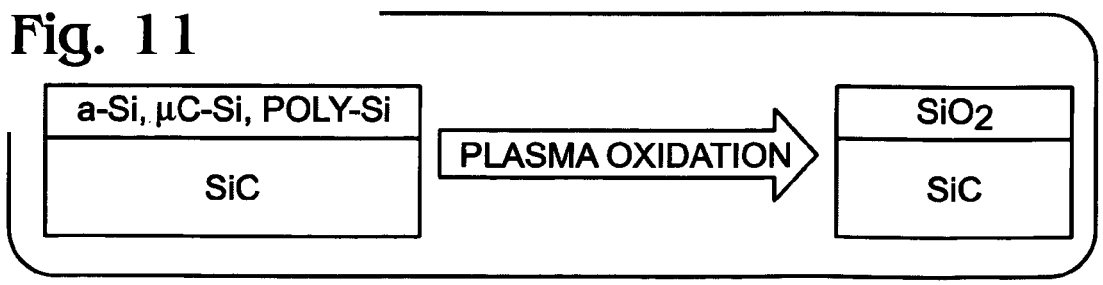
FIG. 11 is a partial cross-sectional view of SiO2/SiC interface formed through the use of a sacrificial Si layer.

FIG. 11 is a partial cross-sectional view of SiO2/SiC interface formed through the use of a sacrificial Si layer. The sacrificial Si layer is subsequently converted to $SiO_2$ by a high-density plasma oxidation process. The sacrificial layer can be an amorphous silicon, micro-crystalline silicon, or polysilicon layer deposited by any suitable technique. The sacrificial silicon layer can be converted using the high-density plasma oxidation process described above (see FIG. 5). The use of a sacrificial layer ensures that the SiC is not consumed in the oxidation process, and that its surface quality and interface properties are suitable for device applications. This scheme solves major issues related to excess C contamination at the interface, and in the bulk of the film.

The ICP is a linear source that can be scaled-up for large area processing. Although the invention has been explained in the context of an ICP source, the high-density plasma processes described above can be carried out using any high-density plasma source capable of generating electron concentrations of higher than $10^{10}$ cm$^{-3}$, and an electron temperature sufficient to generate reactive oxygen species for the deposition/growth of $SiO_2$ thin films.

In other aspects of the invention, the oxygen source can be replaced by ozone, or other oxygen-containing gases for the growth/deposition of $SiO_2$ film. The high-density plasma process can be combined with a suitable radiation source (<300 nm) to control the plasma energy and density distribution and, hence, the growth/deposition kinetics and the properties of the $SiO_2$ film. C contamination, and other impurities can also be minimized using this approach.

A low temperature SiC deposition process, or bulk SiC wafer transfer by wafer bonding approach, enables the integration of SiC-based high temperature and high power electronic devices on low temperature substrates such as glass. The high density plasma growth and deposition rates do not show any strong dependence on the processing temperature, which makes the process compatible with any suitable low temperature substrates.

The plasma grown/deposited $SiO_2$ thin film can be used for the passivation of SiC devices. The quality of Schottky contacts on SiC is typically enhanced by growing a sacrificial oxide, and etching the oxide prior to metallization. The high-density plasma process can be used to grow the sacrificial oxide at significantly lower temperatures and thermal budgets, as compared to thermal growth processes. Further, multilayer gate oxide structures on SiC can be processed by the high-density plasma-based growth/deposition methods.

Methods have been provided for the formation of SiO2 on a SiC substrate using a variety of HD plasma-based processes. Process specifics have been described to help clarify the various aspects of the invention, but the invention is not limited to merely these examples. Other variations and embodiments of the invention will occur to those skilled in the art.

We claim:

1. A method for forming silicon dioxide (SiO2) on a silicon carbide (SiC) substrate, the method comprising:
   providing a SiC substrate;
   supplying an atmosphere including less than 10% oxygen;
   performing a high-density (HD) plasma-based process; and,
   forming a silicon dioxide ($SiO_2$) layer overlying the SiC substrate.

2. The method of claim 1 wherein performing an HD plasma-based process includes connecting a top electrode to an inductively coupled HD plasma source.

3. The method of claim 2 wherein performing an HD plasma-based process includes
   performing an HD plasma oxidation process;
   in response to the HD oxidation process, creating a reactive oxygen species;
   breaking the Si—C bonds in the SiC substrate, to form free Si and C atoms in the SiC substrate; and,
   wherein forming a SiO2 layer overlying the SiC substrate includes bonding the free Si atoms in the SiC substrate to the HD plasma-generated reactive oxygen species, and growing the SiO2 layer.

4. The method of claim 3 wherein providing a SiC substrate includes maintaining the SiC substrate at a temperature of 360 degrees C., or less.

5. The method of claim 3 wherein supplying an atmosphere including less than 10% oxygen includes supplying O2 with an inert gas, where the ratio of inert gas to O2 is in the rage between 10:1 and 200:1.

6. The method of claim 5 wherein supplying the O2 with an inert gas includes using an inert gas selected from the group including Kr, He, and Ar.

7. The method of claim 3 wherein performing an HD plasma-based process further includes bonding the free C atoms in the SiC substrate with the reactive oxygen species, forming carbon monoxide (CO); and
   the method further comprising:
   removing the CO from the process.

8. The method of claim 3 wherein supplying an atmosphere including less than 10% oxygen includes supplying a pressure of up to 500 milliTorr (mTorr), with a mixture of inert gases and oxygen in a ratio of approximately 10:1 to 200:1, and a total gas flow of approximately 50 to 200 standard cubic centimeters per minute (sccm); and,
   wherein performing a HD plasma-based oxidation process includes:
   locating the SiC substrate between a bottom electrode and the top electrode;
   supplying a power density of up to 10 watts per square centimeter ($W/cm^2$), at a frequency in the range of 13.56 to 300 megahertz (MHz), to the top electrode; and,
   supplying a power density of up to 3 $W/cm^2$, at a frequency in the range of 50 kilohertz (KHz) to 13.56 MHz, to the bottom electrode.

9. The method of claim 3 wherein forming a SiO2 layer overlying the SiC substrate includes forming a SiO2 layer at deposition rate of about 100 Å, in 10 minutes.

10. The method of claim 2 wherein supplying an atmosphere including less than 10% oxygen includes additionally supplying SiH4, N2O, and N2;
    wherein performing an HD plasma-based process includes:
    performing an HD plasma enhanced chemical vapor deposition (PECVD) process; and,
    in response to the HD PECVD process, causing a reaction between the gases in the atmosphere; and,
    wherein forming a SiO2 layer overlying the SiC substrate includes depositing a SiO2 layer over the SiC.

11. The method of claim 10 providing a SiC substrate includes maintaining the SiC substrate at a temperature of 400 degrees C., or less.

12. The method of claim 10 wherein supplying SiH4, N2O, and N2 includes supplying SiH4, N2O, and N2 in a ratio of 10–25:100:50.

13. The method of claim 10 wherein supplying an atmosphere including less than 10% oxygen includes maintaining an atmosphere pressure in the range of 10 to 500 mTorr.

14. The method of claim 10 wherein supplying an atmosphere including less than 10% oxygen includes supplying a pressure of up to 500 mTorr, with a mixture of inert gases and oxygen in a ratio of approximately 10:1 to 200:1, and a total gas flow of approximately 50 to 200 sccm; and,
    wherein performing a HD PECVD process includes:
    locating the SiC substrate between a bottom electrode and the top electrode;
    supplying a power density of up to 10 $W/cm^2$, at a frequency in the range of 13.56 to 300 MHz, to the top electrode; and,
    supplying a power density of up to 3 $W/cm^2$, at a frequency in the range of 50 KHz to 13.56 MHz, to the bottom electrode.

15. The method of claim 10 providing a SiC substrate includes maintaining the SiC substrate at a temperature of 150 degrees C., or less.

16. The method of claim 2 further comprising:
    prior to the HD plasma-based process, depositing a Si layer overlying the SiC substrate;
    wherein performing an HD plasma-based process includes:
    performing an HD oxidation process;
    in response to the HD oxidation process, creating a reactive oxygen species;
    wherein forming a SiO2 layer overlying the SiC substrate includes bonding Si atoms in the Si layer to the reactive oxygen species, growing a SiO2 layer overlying the Si layer.

17. The method of claim 16 wherein depositing a Si layer overlying the SiC substrate includes depositing a Si layer selected from the group including amorphous Si, polycrystalline Si, and single-crystal Si.

18. The method of claim 16 providing a SiC substrate includes maintaining the SiC substrate at a temperature of 400 degrees C., or less.

19. The method of claim 16 wherein supplying an atmosphere including less than 10% oxygen includes supplying a pressure of up to 500 mTorr, with a mixture of inert gas and oxygen in a ratio of approximately 10:1 to 200:1, and a total gas flow of approximately 50 to 200 sccm; and,
wherein performing a HD oxidation process includes:
locating the SiC substrate between a bottom electrode and the top electrode;
supplying a power density of up to 10 W/cm$^2$, at a frequency in the range of 13.56 to 300 MHz, to the top electrode; and,
supplying a power density of up to 3 W/cm$^2$, at a frequency in the range of 50 KHz to 13.56 MHz, to the bottom electrode.

20. The method of claim 19 wherein supplying a pressure of up to 500 mTorr, with a mixture of inert gases and oxygen in a ratio of approximately 10:1 to 200:1, includes mixing oxygen with an inert gas selected from the group including helium, argon, and krypton.

21. The method of claim 16 wherein depositing a Si layer overlying the SiC substrate includes depositing a Si layer selected from the group including amorphous Si, polycrystalline Si, and single-crystal Si.

22. The method of claim 2 further comprising:
depositing a Si layer;
wherein performing an HD plasma-based process includes:
initially performing an HD oxidation process;
in response to the HD oxidation process, creating a reactive oxygen species;
wherein performing an HD plasma-based process includes:
subsequently performing a HD PECVD process;
in response to the HD PECVD process, causing a reaction between gases in the atmosphere;
wherein supplying an atmosphere including less than 10% oxygen includes, with respect to the PECVD process, supplying SiH4, N2O, and N2;
wherein forming a SiO2 layer overlying the SiC substrate includes a combination of growing and depositing a SiO2 layer over the Si layer.

23. The method of claim 22 providing a SiC substrate includes maintaining the SiC substrate at a temperature of 400 degrees C., or less.

24. The method of claim 22 wherein supplying an atmosphere including less than 10% oxygen includes supplying a pressure of up to 500 mTorr, with a mixture of inert gas and oxygen in a ratio of approximately 10:1 to 200:1, and a total gas flow of approximately 50 to 200 sccm; and,
wherein performing a HD oxidation process includes:
locating the SiC substrate between a bottom electrode and the top electrode;
supplying a power density of up to 10 W/cm$^2$, at a frequency in the range of 13.56 to 300 MHz, to the top electrode; and,
supplying a power density of up to 3 W/cm$^2$, at a frequency in the range of 50 KHz to 13.56 MHz, to the bottom electrode.

25. The method of claim 24 wherein supplying a pressure of up to 500 mTorr, with a mixture of inert gases and oxygen in a ratio of approximately 10:1 to 200:1, includes mixing oxygen with an inert gas selected from the group including helium, argon, and krypton.

26. The method of claim 22 wherein supplying SiH4, N2O, and N2 in the HD PECVD process includes supplying SiH4, N2O, and N2 in a ratio of 10–25:100:50.

27. The method of claim 26 wherein supplying an atmosphere including less than 10% oxygen includes supplying a pressure of up to 500 mTorr, with a mixture of inert gas and oxygen in a ratio of approximately 10:1 to 200:1, and a total gas flow of approximately 50 to 200 sccm; and,
wherein performing a HD PECVD process includes:
locating the SiC substrate between a bottom electrode and the top electrode;
supplying a power density of up to 10 W/cm$^2$, at a frequency in the range of 13.56 to 300 MHz, to the top electrode; and,
supplying a power density of up to 3 W/cm$^2$, at a frequency in the range of 50 KHz to 13.56 MHz, to the bottom electrode.

28. The method of claim 2 wherein performing an HD plasma-based process includes:
performing an HD oxidation process;
in response to the HD oxidation process, creating a reactive oxygen species;
wherein forming a SiO2 layer overlying the SiC substrate includes bonding the free Si atoms in the SiC substrate to the HD plasma-generated reactive oxygen species, and growing the SiO2 layer;
the method further comprising:
etching the SiO2 layer, exposing a region of the SiC substrate; and,
depositing a metal in the exposed region of SiC substrate to form a metal-semiconductor contact.

29. The method of claim 1 wherein forming a SiO2 layer overlying the SiC substrate includes forming a SiO2 layer having a bias temperature stress (BTS) of less than 1 volt, at 150 degrees C, with a bias voltage of +/−2 megavolts per centimeter (MV/cm).

30. The method of claim 1 wherein forming a SiO2 layer overlying the SiC substrate includes forming a SiO2 layer having a breakdown strength of greater than 10 MV/cm.

31. The method of claim 1 wherein forming a SiO2 layer overlying the SiC substrate includes forming a SiO$_2$ layer having a leakage current density of less than $1\times10^{-7}$ amps per square centimeter (A/cm$^2$), at an applied field of 8 MV/cm.

* * * * *